United States Patent
Gutierrez Hernandez et al.

(10) Patent No.: US 10,989,740 B2
(45) Date of Patent: Apr. 27, 2021

(54) CLOSED-LOOP CURRENT TRANSDUCER

(71) Applicant: LEM INTELLECTUAL PROPERTY SA, Fribourg (CH)

(72) Inventors: Diego Neftali Gutierrez Hernandez, Prévessin-Moëns (FR); Steve Mouchet, Pringy (FR); Steve Moureaux, Bonne (FR)

(73) Assignee: LEM International SA, Plan-les-Ouates (CH)

( * ) Notice: Subject to any disclaimer, the term of this patent is extended or adjusted under 35 U.S.C. 154(b) by 164 days.

(21) Appl. No.: 16/340,623

(22) PCT Filed: Oct. 6, 2017

(86) PCT No.: PCT/EP2017/075435
§ 371 (c)(1),
(2) Date: Apr. 9, 2019

(87) PCT Pub. No.: WO2018/069166
PCT Pub. Date: Apr. 19, 2018

(65) Prior Publication Data
US 2019/0277888 A1 Sep. 12, 2019

(30) Foreign Application Priority Data
Oct. 11, 2016 (EP) .................................. 16193390

(51) Int. Cl.
*G01R 15/18* (2006.01)
*G01R 15/20* (2006.01)
(Continued)

(52) U.S. Cl.
CPC ......... *G01R 15/186* (2013.01); *G01R 15/202* (2013.01); *G01R 15/205* (2013.01);
(Continued)

(58) Field of Classification Search
CPC .. G01R 15/185; G01R 15/186; G01R 15/202; G01R 15/205; G01R 15/207; H01F 27/266; H01F 27/306; H01F 27/325; H01F 38/30
See application file for complete search history.

(56) References Cited

U.S. PATENT DOCUMENTS

| 5,617,019 A | 4/1997 | Etter |
| 7,965,162 B2 * | 6/2011 | Schaerrer ............. G01R 15/185 336/175 |

(Continued)

FOREIGN PATENT DOCUMENTS

| CN | 104124041 | 10/2014 |
| EP | 0886147 | 12/1998 |

(Continued)

OTHER PUBLICATIONS

International Search Report and Written Opinion of the International Searching Authority, dated Jan. 30, 2018, for International Patent Application No. PCT/EP2017/075435; 12 pages.

*Primary Examiner* — Minh N Tang
(74) *Attorney, Agent, or Firm* — Faegre Drinker Biddle & Reath LLP

(57) ABSTRACT

A closed-loop current transducer comprising a magnetic circuit core made of a material with a low magnetic reluctance to conduct magnetic flux and concentrate a magnetic field, a magnetic field detector positioned in a magnetic circuit gap of the magnetic circuit core, and a compensation coil assembly comprising a compensation coil and a compensation coil support comprising a coil support bobbin, the compensation coil being wound around the coil support bobbin. The magnetic circuit comprises a first longitudinal branch, a second longitudinal branch, and first and second end branches interconnecting the first and second longitudinal branches such that the branches surround a central (Continued)

opening configured to receive one or more primary conductors therethrough, the magnetic circuit being formed of first and second parts assembled together from opposed ends of the compensation coil support.

14 Claims, 9 Drawing Sheets

(51) Int. Cl.
    *G01R 19/00*     (2006.01)
    *H01F 27/32*     (2006.01)
    *G01R 33/00*     (2006.01)

(52) U.S. Cl.
    CPC ....... *G01R 15/207* (2013.01); *G01R 19/0092* (2013.01); *H01F 27/325* (2013.01); *G01R 33/0011* (2013.01)

(56) References Cited

U.S. PATENT DOCUMENTS

| | | | |
|---|---|---|---|
| 8,618,796 B2 * | 12/2013 | Teppan | G01R 15/18 324/253 |
| 2010/0264905 A1 | 10/2010 | Schmitt | |
| 2013/0088804 A1 | 4/2013 | Liang | |
| 2013/0241533 A1 | 9/2013 | Lin | |

FOREIGN PATENT DOCUMENTS

| | | |
|---|---|---|
| EP | 1617228 | 1/2006 |
| EP | 2083277 | 7/2009 |
| EP | 2660611 | 11/2013 |

\* cited by examiner

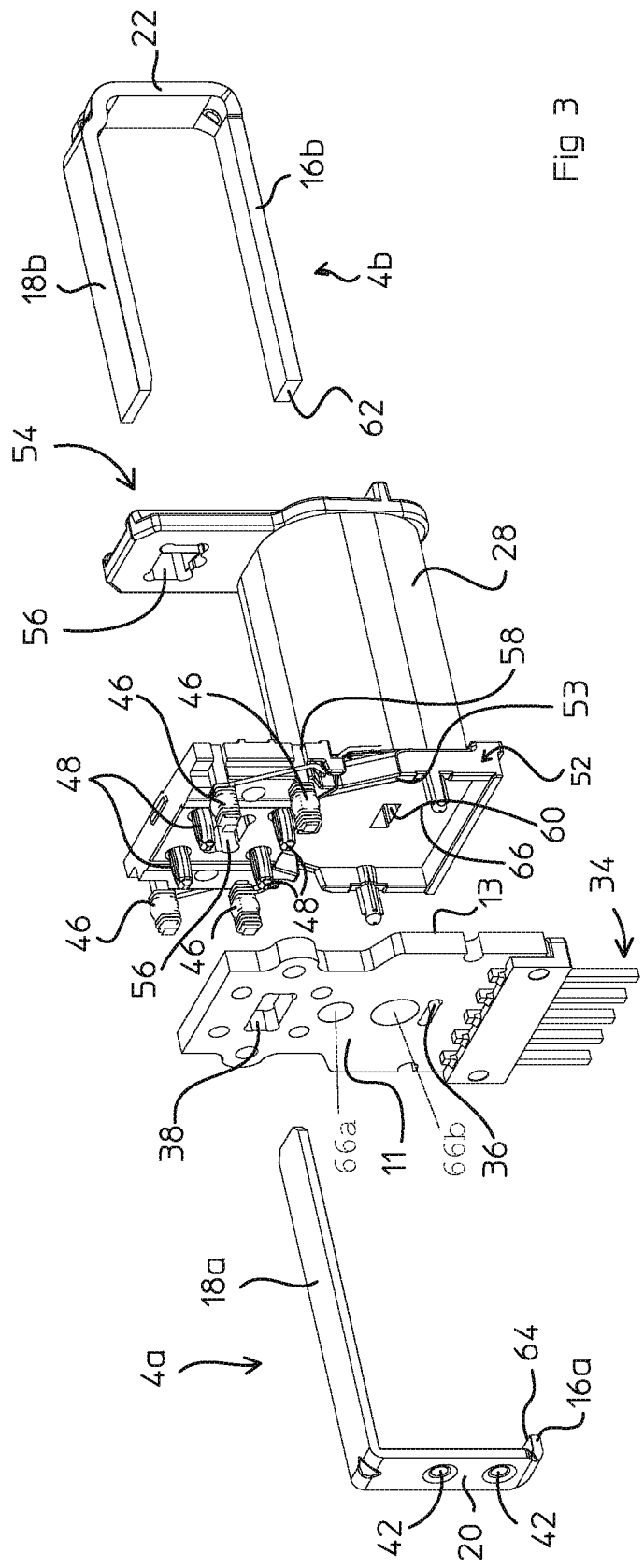

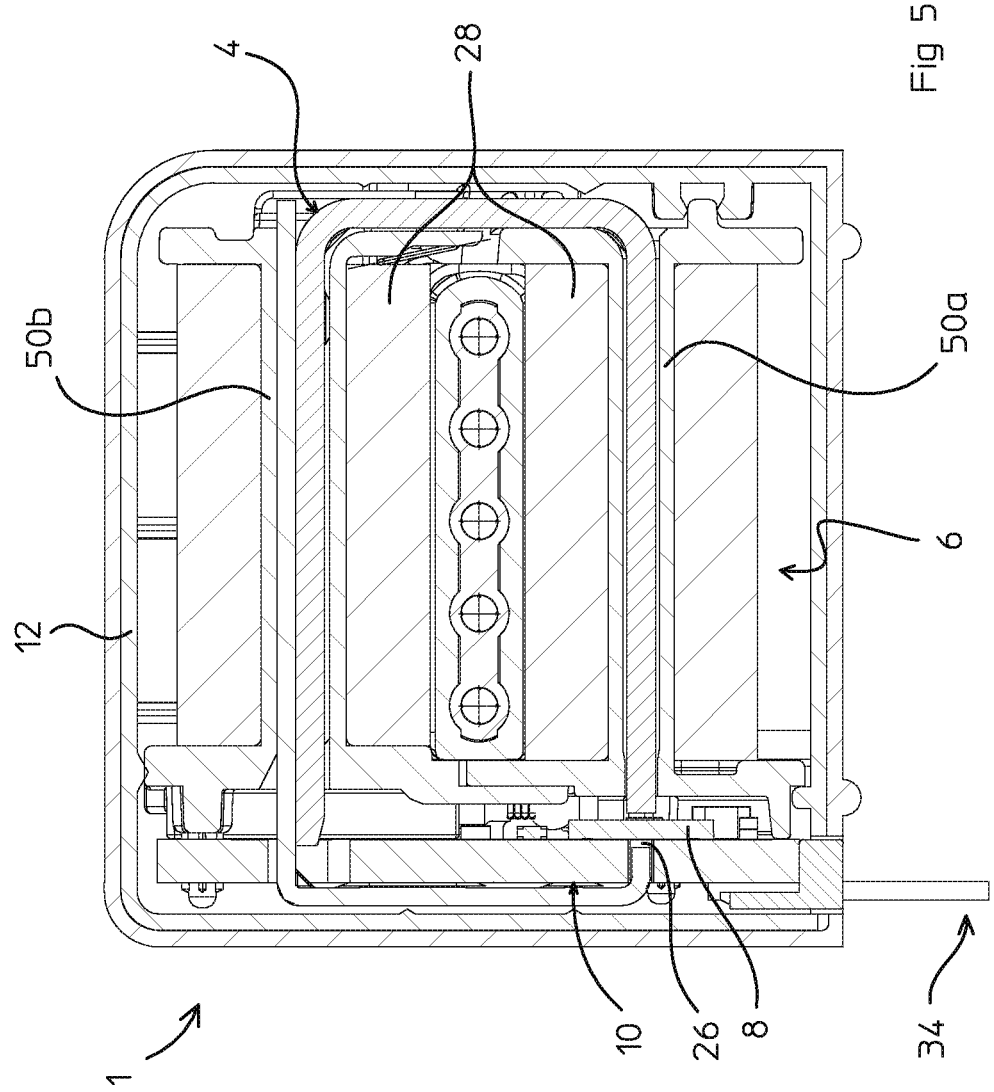

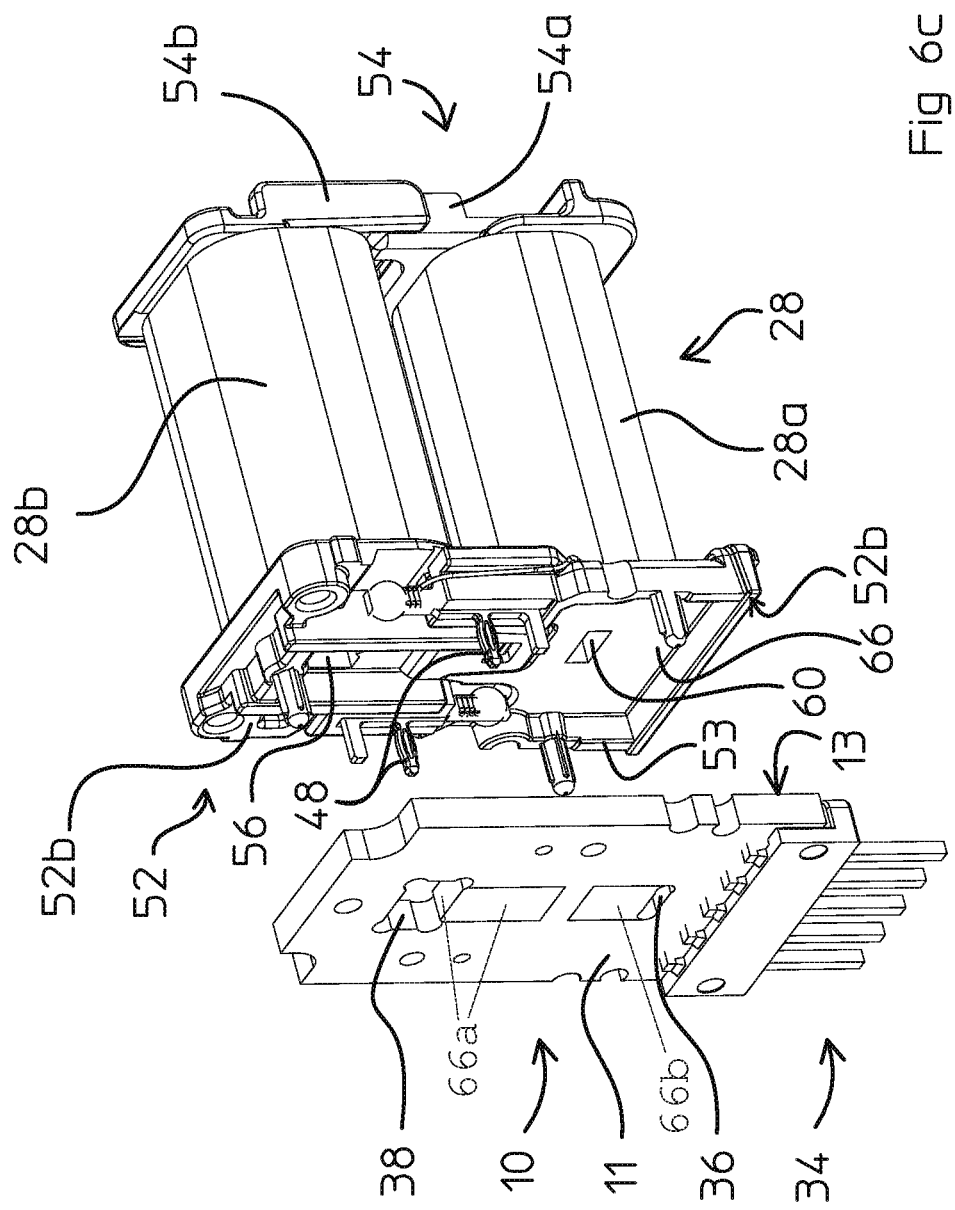

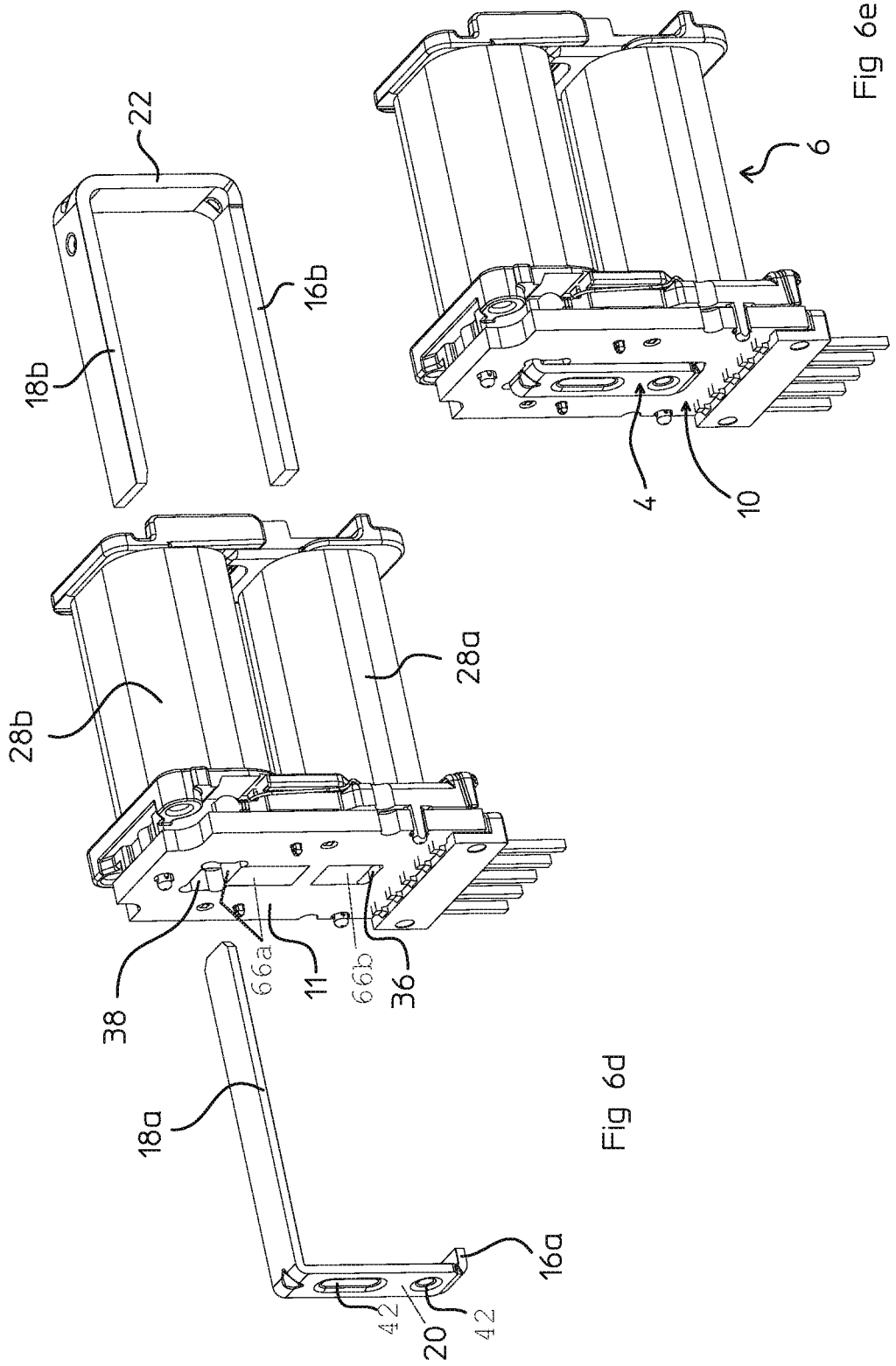

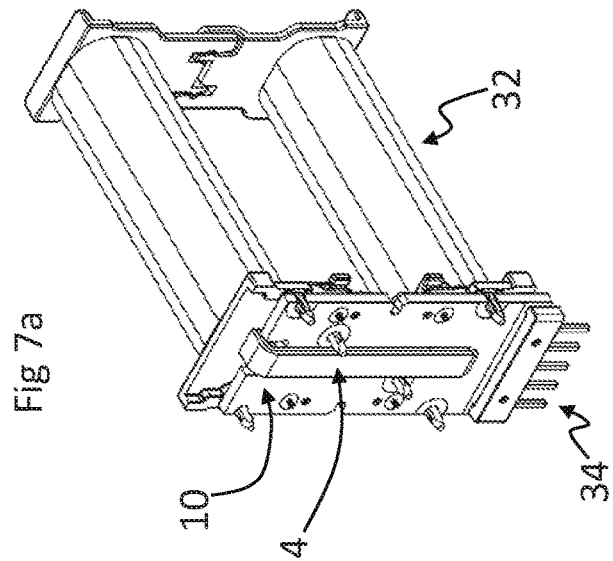
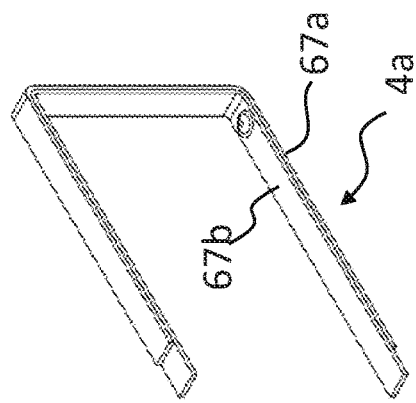
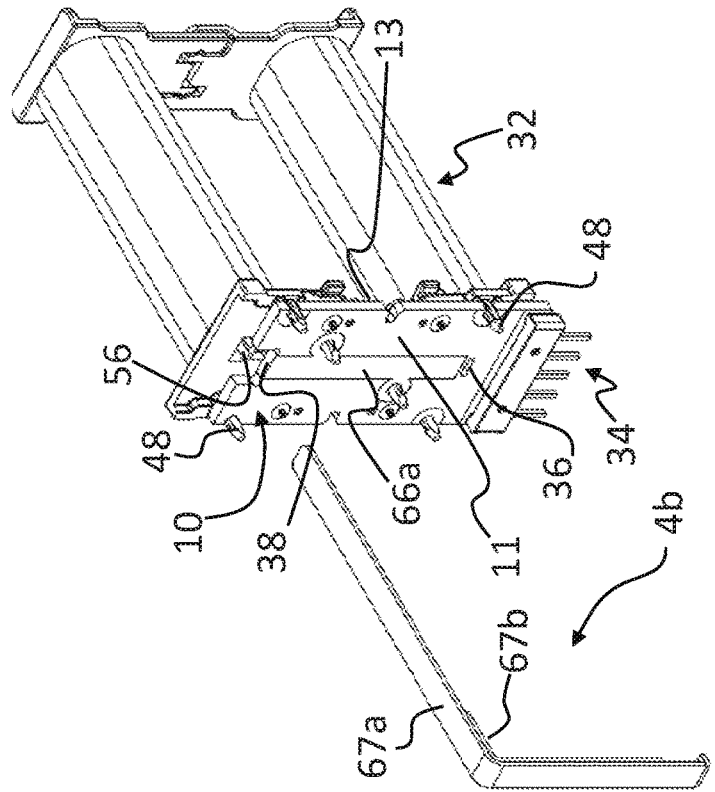
Fig 7a
Fig 7b

CLOSED-LOOP CURRENT TRANSDUCER

CROSS-REFERENCE TO RELATED APPLICATIONS

The present application is a national stage entry of International (PCT) Patent Application Number PCT/EP2017/075435, filed Oct. 6, 2017, which in turn claims priority to European Patent Application No. 16193390.8, filed Oct. 11, 2016, the subject matter of which are expressly incorporated herein by reference.

The present invention relates to an electrical current transducer of the closed-loop type.

The invention concerns current sensors of the closed-loop type, having a compensation circuit with secondary coil for cancelling the magnetic flux induced in the magnetic circuit. Closed-loop current transducers are widely used in a large number of current and voltage measurement applications. In such transducers, the magnetic flux in the magnetic circuit is very low, since the compensation coil, also commonly called secondary coil, is driven in a feedback loop to cancel the magnetic field induced by the current to be measured (primary current), the resultant magnetic field being picked up by a magnetic field sensor which thus needs to have a high sensitivity for accurate and rapid response of the current sensor. Various magnetic field sensors including Hall effect detectors, pick-up coils, or fluxgate sensors, may be employed in so-called closed-loop current sensors. Hall effect detectors are widely used in view of their low cost and robustness compared to many other magnetic field detectors. They are however not as sensitive as certain magnetic field detectors and thus are preferably positioned in an air-gap of the magnetic circuit where the magnetic field is concentrated. The size of the airgap effects the magnetic flux density and it is therefore important to ensure an accurate controlled dimensioning of the air gap in order to increase transducer accuracy.

There is a continuous desire to reduce manufacturing costs while increasing the performance and reliability of current transducers, which may include aspects such as measurement accuracy, large measurement operating range, reduced sensitivity to disturbing external magnetic fields, manufacturing repeatability, stability over time and usage, and robustness. One of the main factors in the manufacturing cost of a current transducer is in the assembly of the components forming the transducer.

It is an object of this invention to provide an electrical current transducer that is accurate, reliable and robust, yet economical to manufacture.

It is advantageous to provide a closed-loop electrical current transducer that is simple to assemble and that has few components.

It is advantageous to provide a closed-loop electrical current transducer that is robust and stable over time.

It is advantageous to provide a closed-loop electrical current transducer that is compact.

Various objects of this invention have been achieved by providing a current transducer according to the present disclosure.

Disclosed herein, is a closed-loop current transducer comprising a magnetic circuit core made of a material with a low magnetic reluctance to conduct magnetic flux and concentrate a magnetic field, a magnetic field detector, and a compensation coil assembly comprising a compensation coil and a compensation coil support comprising at least one coil support bobbin. The compensation coil is configured to generate a magnetic field opposing a magnetic field created by an electrical current to be measured flowing in one or more primary conductors extending through a central opening of the magnetic circuit. The coil support bobbin comprises a connection end flange at one end thereof and a second flange at a second end thereof. The compensation coil is wound around the coil support bobbin between the connection end and second flanges. The magnetic circuit comprised a first longitudinal branch, a second longitudinal branch, and first and second end branches interconnecting the first and second longitudinal branches such that the branches surround a central opening configured to receive one or more primary conductors therethrough.

The magnetic circuit is formed of first and second parts assembled together from opposed ends of the compensation coil support. A circuit board is mounted against and parallel to the connection end mounting flange and the first part of the magnetic circuit core comprises the first end branch and is assembled from an outer face of the circuit board relative to the connection end mounting flange such that the first end branch is positioned adjacent and against said outer face of the circuit board. The circuit board comprises orifices through which portions of the first and second longitudinal branches extend through the circuit board. The magnetic field detector is connected to the circuit board and positioned in a magnetic circuit gap of the magnetic circuit core.

In an embodiment, the compensation coil assembly comprises a first coil support bobbin with a first portion of the compensation coil wound therearound, and a second coil support bobbin with a second portion of the compensation coil wound therearound, the first coil support bobbin mounted on the first longitudinal branch of the magnetic circuit, and the second coil support bobbin mounted on the second longitudinal branch of the magnetic circuit. The first and second coil support bobbins are coupled together and the first and second portions of the compensation coil are formed of a single uninterrupted wire.

In an advantageous embodiment, the number of turns of the compensation coil wound around the first coil support bobbin is greater than the number of turns of the compensation coil would around the second coil support bobbin.

In an advantageous embodiment, the first and second coil support bobbins are coupled together via a hinge coupling configured to allow the first coil support bobbin to rotate relative to the second coil support bobbin from a longitudinally aligned position to a parallel assembled position.

In an advantageous embodiment, the first and second coil support bobbins comprise complementary latching elements configured to lock the coil support bobbins in the parallel assembled position.

In an advantageous embodiment, the first end branch of the magnetic circuit core contacts at least one conductive circuit pad on the outer face of the circuit board that is connected to ground.

In an embodiment, the first end branch of the magnetic circuit core comprises one or more contact protrusions that press against the one or more conductive circuit pads.

In an advantageous embodiment, the first end branch is soldered to said conductive circuit pad.

In an advantageous embodiment, the conductive circuit pad extends over the edge of the orifice to pass from an outer side of the circuit board to an inner side of the circuit board.

In an advantageous embodiment, the first part of the magnetic circuit comprises a portion of the second longitudinal branch and the second part of the magnetic circuit comprises a portion of the second longitudinal branch whereby said portions overlap and press against each other to ensure good contact between the longitudinal branch portions and reduce the magnetic reluctance therebetween.

In an advantageous embodiment, the portions of the second longitudinal branch overlap each other substantially over an entire length between the connection end flange and the second end flange.

In an advantageous embodiment, a portion of the first longitudinal branch of the first part of the magnetic circuit core extends through the thickness of the magnetic circuit board to an inner face of the magnetic circuit board on which the magnetic field detector is mounted. An end of said portion of the first longitudinal branch of the first part is positioned facing an end of a portion of the first longitudinal branch of the second part to form the magnetic circuit gap. The magnetic field detector is mounted on the circuit board inner face.

In an advantageous embodiment, the connection end flange comprises a recess configured to allow the positioning of the magnetic field detector and optionally other components mounted on the circuit board within the recess.

In an advantageous embodiment, the edge of the connection flange is mounted against the inner face of the circuit board.

In an advantageous embodiment, the magnetic field detector is a Hall effect sensor provided in the form of an application specific integrated circuit (ASIC) with connection terminals connected to circuit traces on the circuit board.

In an advantageous embodiment, the major plane of the circuit board is parallel to the major plane of the connection end flange, said major planes being arranged essentially orthogonal to the first and second longitudinal branches of the magnetic circuit core.

In an advantageous embodiment, the connection terminals of the compensation coil assembly comprise an essentially U-shaped terminal having a wire connection post for connection of a compensation coil wire end thereto and a pin terminal connection end for plugging into conductive through holes in the circuit board.

In an advantageous embodiment, the connection terminals are mounted in the connection end flange.

In an advantageous embodiment, the compensation coil support comprising the coil support bobbin, connection end flange, and second flange is formed of a single integrally formed piece, preferably an injected plastic part.

In an embodiment, the first and second parts of the magnetic circuit each comprise two or more stacked layers of strips of magnetic material.

Further objects and advantageous aspects of the invention will be apparent from the claims, the following detailed description, and drawings in which:

FIG. 3 is an exploded view in perspective of the transducer of FIG. 2a;

FIG. 4a is a cross sectional view of the embodiment of FIG. 2a;

FIG. 4b is an enlarged view of a portion of FIG. 4a;

FIG. 5 is a cross sectional view of another embodiment of a current transducer according to this invention;

FIGS. 6a to 6e are views in perspective showing assembly of a coil assembly to a circuit board and magnetic circuit of the embodiment of FIG. 5, in which:

FIG. 6a shows the coil assembly in an unassembled position after winding of a wire forming the coil;

FIG. 6b shows the coil assembly in an assembled position ready for assembly to other components of the transducer;

FIG. 6c shows the coil assembly of FIG. 6b being assembled to a circuit board of the transducer;

FIG. 6d shows a magnetic circuit being assembled to the coil assembly and circuit board of FIG. 6c; and FIG. 6e shows the coil assembly assembled to the circuit board and magnetic circuit of the transducer;

FIG. 7a is a perspective view of a current transducer according to an embodiment of this invention with the housing, primary conductors, and compensation coils removed;

FIG. 7b is a view of the embodiment of FIG. 7a with the magnetic circuit in an exploded relation with respect to the coil support and circuit board.

Figure 1A:
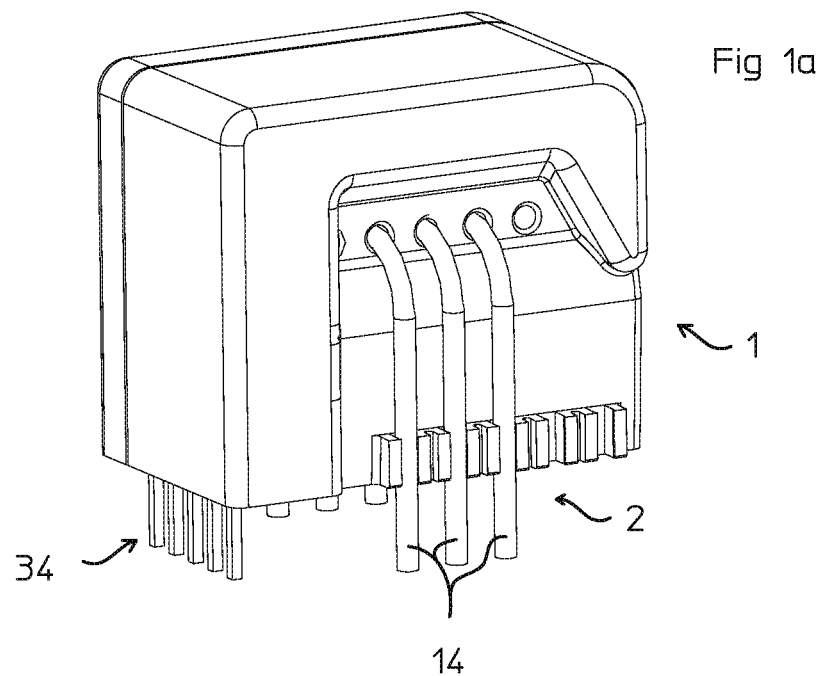
FIG. 1a is a perspective view of a current transducer according to an embodiment of this invention.

Referring to the Figures, an electrical current transducer 1 according to an embodiment of this invention for measuring the current flowing through a primary conductor 2, comprises a magnetic circuit 4, a magnetic field detector 8, and a compensation coil assembly 6 (also sometimes referred to as a secondary coil or winding assembly). The compensation coil assembly is configured to be connected to a signal processing circuit to generate a magnetic field opposing a magnetic field created by the current to be measured (also sometimes referred to as the primary current) flowing through the primary conductor 2. The feedback signal to drive the compensation or secondary coil is generated by the magnetic field detector according to a per se well-known operating principle of closed loop type current transducers.

The magnetic circuit 4, according to the exemplary embodiment illustrated, comprises a first longitudinal branch 16, a second branch 18, and first and second end branches 20, 22 interconnecting the spaced apart and essentially parallel first and second branches 16, 18, such that the branches surround a central passage through which the primary conductor 2 may extend. The branches thus form a circuit with low magnetic reluctance configured to conduct the magnetic flux and concentrate the magnetic field generated by the primary current flowing in the primary conductor. The magnetic circuit 4 is formed from two parts 4a, 4b. A first part 4a comprises a portion 16a of the first longitudinal branch 16, a portion 18a of the second branch 18, and a first end branch 20. A second part 4b comprises a portion 16b of the first longitudinal branch 16, a portion 18b of the second branch 18, and a second end branch 22. Each of the parts is preferably formed from a piece of strip or sheet metal with the desired magnetic properties, most advantageously stamped and formed from a planar piece of sheet or strip of magnetic material. In an embodiment, the first and second parts of the magnetic circuit may each comprise two or more stacked layers 67a, 67b of strips of magnetic material, as best seen in FIGS. 7a, 7b, in order to increase the magnetic flux that can be carried by the magnetic circuit without saturation thereof, thereby increasing the current measurement range of the transducer.

The magnetic circuit 4 comprises a magnetic circuit gap 26, the magnetic field detector 8 positioned in and traversing the magnetic circuit gap. In a preferred embodiment, the magnetic field detector is in the form of a Hall effect sensor that may be provided in the form of an application specific integrated circuit (ASIC) that has connection terminals for connection to circuit traces on a circuit board 10. The magnetic field detector may form an essentially planar component that lies on the circuit board essentially parallel to the circuit board and extends over a first orifice 36 provided in the circuit board for allowing the portion 16a of the first longitudinal branch of the first part 4a of the magnetic circuit to extend through the orifice. It may be noted that the orifice may either be an orifice completely encircled by an edge of the circuit board (as illustrated in the embodiments shown), or may be in the form of a slot extending to an outer edge of the circuit board (not shown). The orifices forms a through passage from one side of the circuit board to the other side of the circuit board in order to allow branches of the magnetic circuit to extend therethrough.

The compensation coil assembly 6 comprises a compensation coil support 32, at least one compensation coil 28 mounted on the compensation coil support 32, and connection terminals 30 for connection to the compensation coil 28 on the one hand, and to the circuit board 10 on the other hand. The compensation coil is made of one or more wires. Connection ends 44 of the wires are connected to wire connection ends 46 of the connection terminals 30.

According to a first embodiment illustrated in FIGS. 2a to 4b, the compensation coil support 32 comprises a single coil support bobbin 50 with a compensation coil 28 wound therearound, mounted on only one of the branches 16 of the magnetic circuit.

According to a second embodiment illustrated in FIGS. 5a to 5c, the compensation coil assembly 6 comprises first and second coil support bobbins 50a, 50b with first and second portions 28a, 28b of the compensation coil 28 wound around respective first and second coil support bobbins mounted on respective parallel branches 16, 18 of the magnetic circuit. In this second embodiment, a larger number of compensation coil windings can be coupled to the magnetic circuit compared to the first embodiment, allowing for a larger magnetic compensation field to be generated for a given compensation current. A larger current measurement range can thus be measured by the second embodiment compared to the first embodiment. Another advantage of providing the first and second portions 28a, 28b of the compensation coil 28 on parallel branches of the magnetic circuit, compared to a single coil portion, is that it helps to obtain a better transient response because of a lower stray inductance due to the opposing relationship of the first and second coil portions.

The compensation coil support comprises a first connection end flange 52, 52a, 52b, on one longitudinal end of the coil support bobbin 50, 50a, 50b, and a second end flange 54, 54a, 54b positioned at the other end of the coil support bobbin, the compensation coil being wound around the coil support bobbin 50, 50a, 50b, between the end flanges 52, 52a, 52b, 54, 54a, 54b. The compensation coil may be formed from a single wire wound around the coil support bobbin.

Figure 6B:
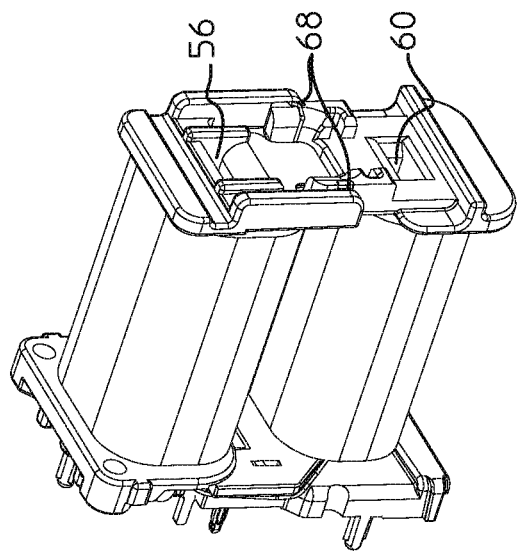
Figure 6A:
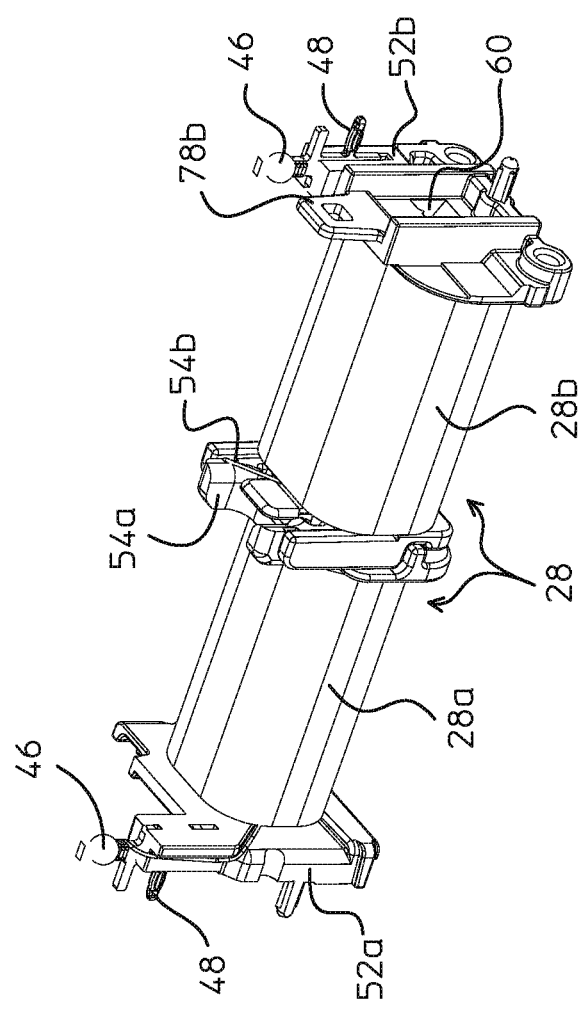

In the second embodiment illustrated in FIGS. 5 to 6e, the compensation coil comprises a single wire wound on both the first coil support bobbin and on the second coil support bobbin. During the winding process, the first and second coil support bobbins are longitudinally aligned with each other, as best illustrated in FIG. 6a. This allows the compensation coil support to be positioned on a rotary jig of a winding tool and rotated about an axis extending in the longitudinal direction aligned with a centre of the coils. The first coil bobbin is wound with the wire, then the wire is passed over the coupled second flanges 54a, 54b, and then the second coil bobbin is wound with the wire without sectioning of the wire. A first end of the wire is connected to a first connection terminal 30 mounted on the first flange 52a of the first coil support bobbin 50a, and a second end of the wire is connected to a second connection terminal 30 mounted on the first flange 52a of the second coil support bobbin 50b. The above described configuration renders the manufacturing process of the coil and the assembly of the coil to the magnetic circuit and other components of the transducer particularly efficient, while providing a compact closed loop transducer with a large operating range.

The number of turns (windings) of the coil positioned around the first coil support bobbin may be different to the number of turns around the second coil support bobbin in order to optimize the magnetic field cancellation effect. In particular, the number of windings around the magnetic circuit branch comprising the magnetic field gap may be greater than the number of windings around the magnetic circuit branch without airgap. For example, the first coil support bobbin may be provided with 1000 turns and the second coil support bobbin with 600 turns. This asymmetrical winding provides a higher usable frequency bandwidth and enhanced di/dt response than a symmetrical winding (for instance, 800 turns on each coil support bobbin)

The second flange 54a of the first coil support bobbin 50a is coupled to the second flange 54b of the second coil support bobbin 50b via a hinge coupling 68 configured to allow the first coil support bobbin to rotate relative to the second coil support bobbin from the aligned position (as shown in FIG. 6a) to the parallel assembled position (as shown in FIG. 6b). In the illustrated embodiment, the hinge coupling is in the form of pin axes on one flange engaging in holes in the other flange. In a variant, the flanges may be connected together via an integrally formed deformable hinge. The first flanges 52a, 52b of the two coil support bobbins 50a, 50b comprise latching elements 78a, 78b that lock the two bobbins together in the parallel assembled position. The latching elements may comprise an elastic cantilever arm 78b projecting from one of the flanges, engaging with a complementary locking protrusion 78a on the other flange.

The connection end flanges and coil support bobbin(s) comprise passages 56, 60 to allow the branches 18, 16 of the magnetic circuit core to be inserted therethrough, the first and second parts 4a, 4b being mounted from opposed ends of the compensation coil support 32.

The second part 4b of the magnetic circuit core 4 comprises a first longitudinal branch portion 16b that extends from the second end branch 22 through the passage 60 within the coil support bobbin 50 up to an end face 62 of the branch portion 16b. The end face 62 of the branch portion 16b is proximate the connection end flange 52, 52a, 52b, so as to form one end face of the magnetic circuit gap 26, facing an end face 64 of the first longitudinal branch portion 16a of the first part 4a of the magnetic circuit core 4. The second longitudinal branch portion 18b of the second part 4b of the magnetic circuit core 4 overlies and is pressed against the second longitudinal branch portion 18a of the first part 4a of the magnetic circuit core 4 so as to form a good contact therebetween to reduce resistance to the magnetic flux therebetween.

The circuit board 10 is positioned against an outer side 53 of the connection end flange 52, 52a, 52b, of the compensation coil support 32, and the major plane of the circuit board is essentially parallel to the major plane of the connection end flange 52, 52a, 52b, major planes being arranged essentially orthogonal to the first and second longitudinal branches 16, 18 of the magnetic circuit core. The circuit board comprises conductive circuit traces that interconnect the connection terminals 30 connected to the compensation coil wire ends, to connection terminals 34 configured for connection to external circuitry or an external connector to which the transducer is to be connected. The connection terminals 34 also serve to supply power to the magnetic field detector 8 mounted on the circuit board and to transmit the measurement signals from the magnetic field detector 8 to external circuitry, as is per se well known in the art. The circuit board 10 is configured to be assembled against the outer side 53 of the connection end flange 52, 52a, 52b such that the connection terminals 30 connected to the wires of the compensation coil 28 are interconnected to the conductive circuit traces on the circuit board during assembly of the circuit board to the flange.

The compensation coil assembly connection terminals 30 may in an advantageous embodiment comprise an essentially U-shaped terminal having a wire wrap connection post 46 for wrapping of the compensation coil wire ends therearound and pin terminal connection ends 48 for plugging into plated through holes in the circuit board 10. Other connection ends may be provided, for instance for surface mount or spring biased contacts against circuit traces of the circuit board.

The first part 4a of the magnetic circuit core 4 is, according to an aspect of the invention, assembled from an outer side 11 of the circuit board 10 relative to the connection end mounting flange 52 such that the first end branch 20 of the magnetic circuit core first part 4a is positioned adjacent and against said outer side 11 of the circuit board 10. Orifices 36, 38 extending through the circuit board allow the first longitudinal branch portion 16a, respectively second longitudinal branch portion 18a to be inserted through the circuit board. The second longitudinal branch portion 18a of the first part may extend essentially over the second longitudinal branch portion 18b of the second part 4b up to the second flange 54, 54b to ensure good contact between the longitudinal branch portions 18a, 18b to reduce the magnetic reluctance therebetween. The first longitudinal branch portion 16a of the first part 4a of the magnetic circuit core 4 is however configured to extend through the thickness of the magnetic circuit board 10 to an inner face 13 of the magnetic circuit board on which the magnetic field detector 8 is mounted. This allows the end 64 of the first longitudinal branch portion 16a of the first part 4a to be positioned facing the end 62 of the first longitudinal branch portion 16b of the second part 4b to form the magnetic circuit gap 26 with a defined width W in which the magnetic field detector 8 mounted on the circuit board inner face 13 is positioned.

The first end branch 20 of the magnetic circuit core may advantageously be provided with one or more contact protrusions 42 that press against the outer face 11 of the circuit board. The contact protrusions may serve on the one hand to contact conductive circuit pads 66a, 66b on the circuit board that are connected to ground in order to connect the magnetic circuit to ground, and/or to accurately position the end 64 of the first longitudinal branch portion 16a of the first part with respect to the circuit board and therefore to accurately define the magnetic circuit gap width W. The contact protrusions 42 which project towards the outer face of the circuit board 10 may be soldered, welded or bonded to the circuit board in order to rigidly fix the first part 4a of the magnetic circuit core 4 to the circuit board and therethrough to the compensation coil assembly 6.

In an embodiment, at least one of the conductive circuit pads 66a may extend over and around an edge of the orifice 38 to an opposite side of the circuit board for connection to a grounding circuit trace on the inner face 13 of the circuit board. The conductive coupling between the magnetic circuit core and conductive circuit traces on the circuit board may also advantageously help to better equalize the temperature of the magnetic circuit core and circuit board and to better dissipate heat in the magnetic core. The extension of the contact pad 66b over the edge of the orifice 36 also helps to improve contact between the magnetic circuit core and the conductive contact pad.

The extension of pad 66a over and around an edge of orifice 38 (respectively the extension of pad 66b over and around an edge of the orifice 36) may be executed with a small gap (not shown) in order to reduce eddy currents.

The mounting of the circuit board 20 directly against the connection end flange 52, 52a, 52b, the compensation coil assembly and insertion of the first part 4a of the magnetic circuit core 4 from the outer face 11 of the circuit board allows for a particularly compact, robust and stable arrangement with a well controlled magnetic circuit gap for a magnetic field detector 8 mounted on the circuit board, particularly a magnetic field detector in the form of a Hall ASIC mounted parallel to the circuit board and lying against the inner face 13 of the circuit board facing the connection end flange 52, 52a, 52b. It may be noted that the connection end flange comprises a recess 66 to allow the positioning of the magnetic field detector and optionally other components mounted on the circuit board within the recess while the edge of the connection flange is mounted against the inner face 13 of the circuit board for accurate and stable positioning of the two components.

Figure 1B:
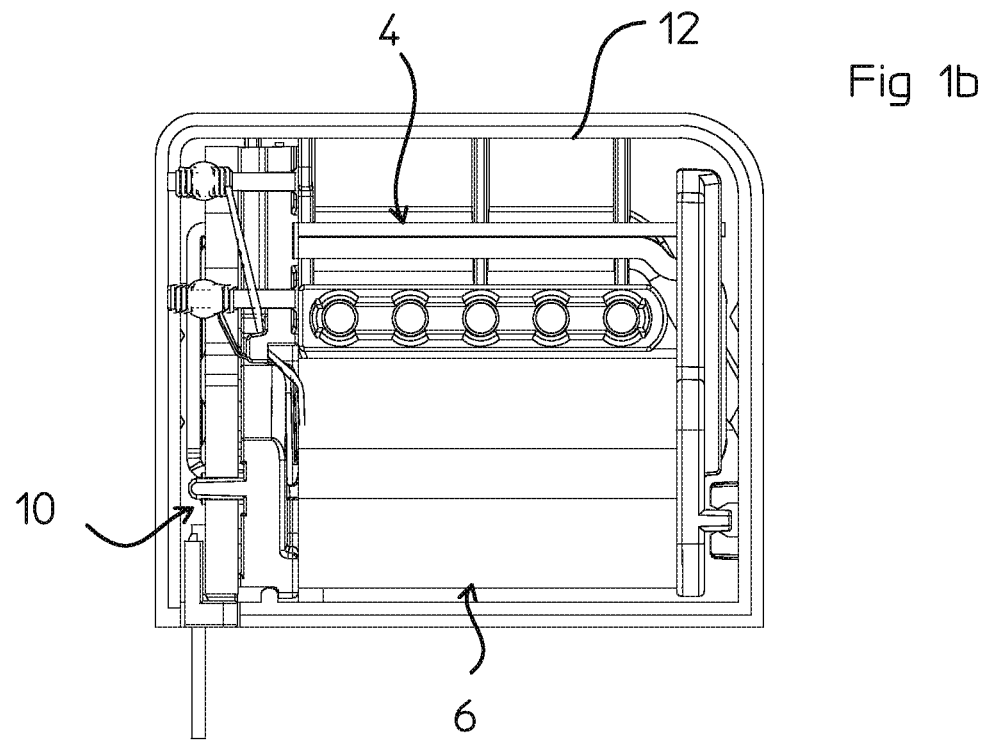
FIG. 1b is a perspective view of the embodiment of FIG. 1a with a housing partially cut away and primary conductors removed.
Figure 2A:
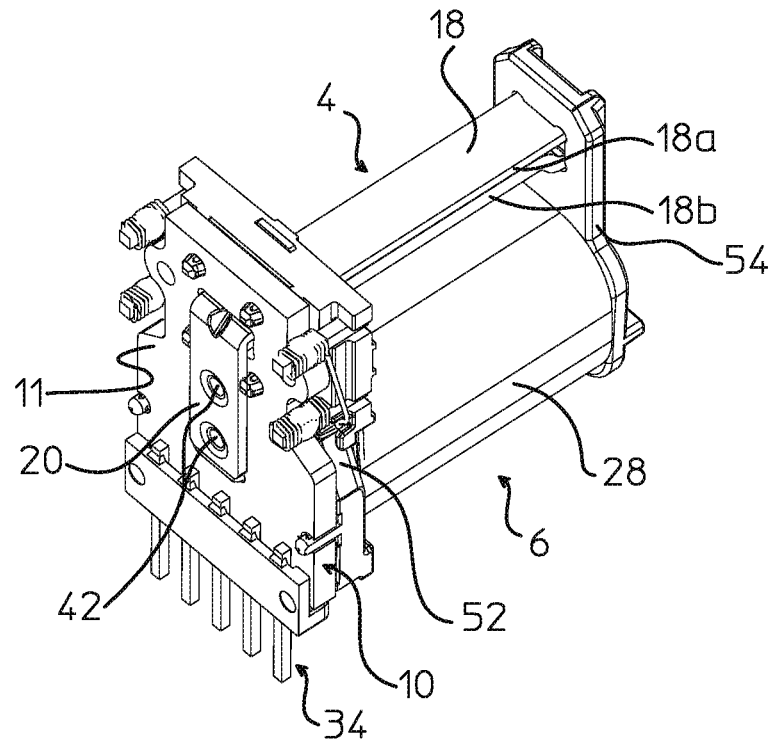
FIGS. 2a and 2b are views in perspective of a current transducer according to an embodiment of this invention with the housing and primary conductors removed.
Figure 2B:
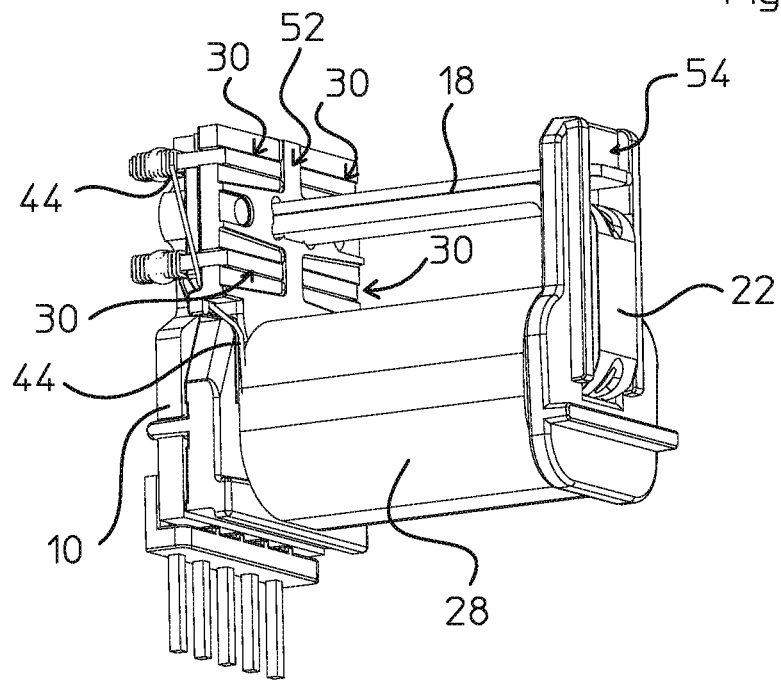
Figure 4A:
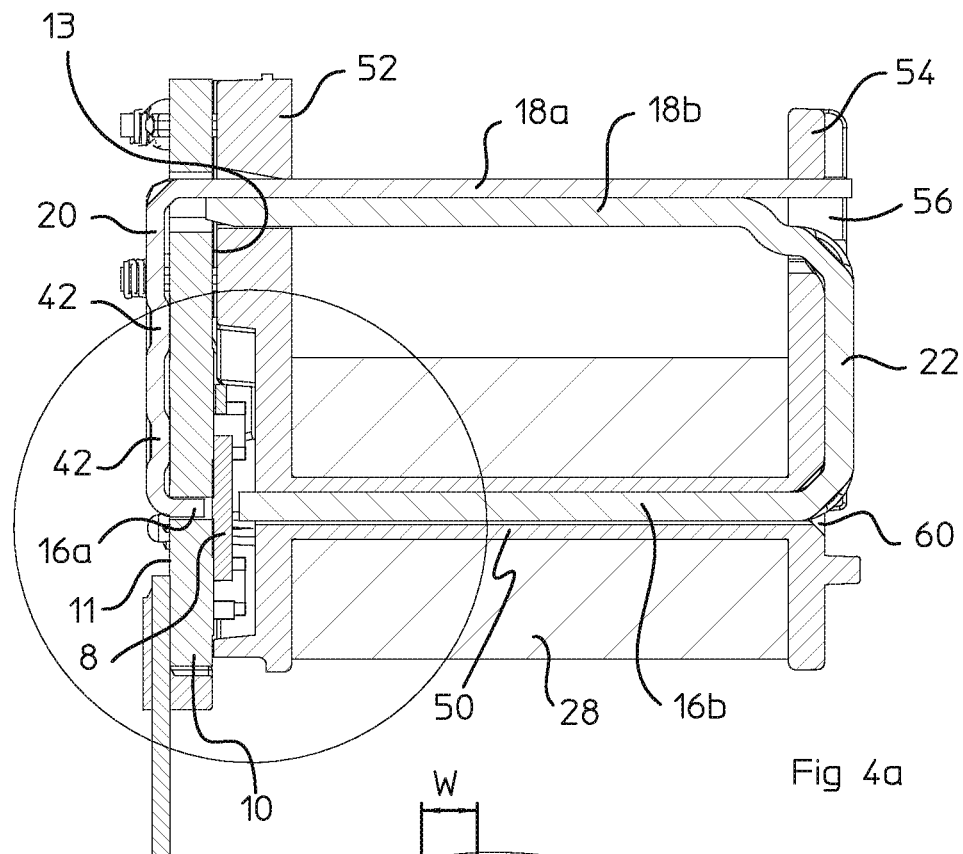
Figure 4B:
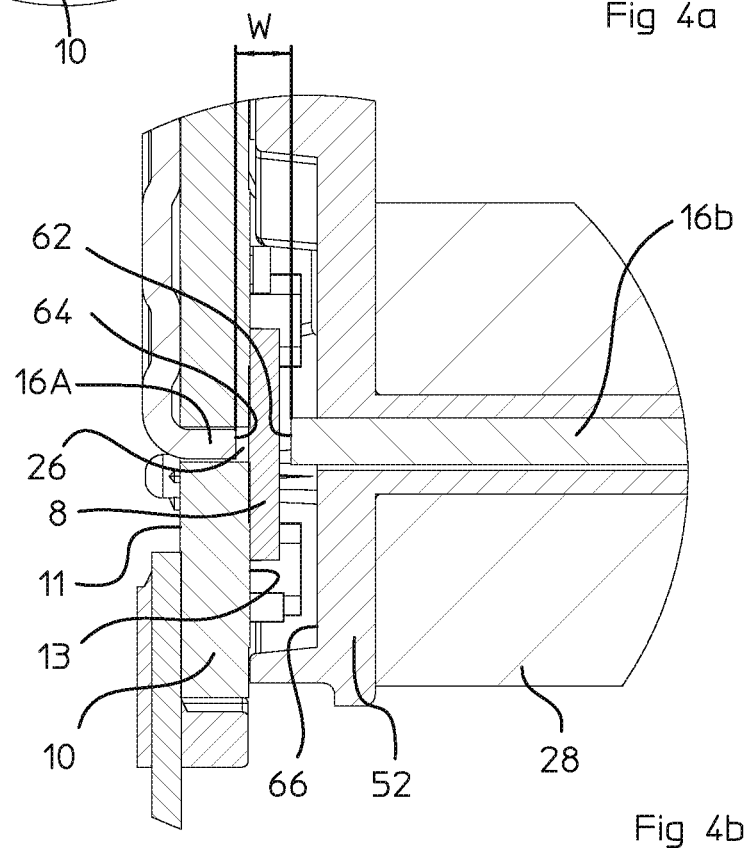

LIST OF REFERENCES IN THE FIGURES 1 electrical current transducer
   2 primary conductor
      14 connection ends
   4 magnetic circuit core
      16 first longitudinal branch
      18 second longitudinal branch
      20 first end branch
         42 contact protrusion
      22 second end branch
      24 corners (joining longitudinal and end branches)
      4a first part
         16a first longitudinal branch portion
            62 airgap endface
         18a second longitudinal branch portion
      4b second part
         16b first longitudinal branch portion
            64 airgap endface
         18b second longitudinal branch portion
      26 magnetic circuit gap (air gap)
      67a, 67b stacked layers of magnetic strip material
   6 compensation coil assembly
      28 compensation coil
      28a, 28b first and second portions of the compensation coil
      44 wire connection ends
      30 connection terminals
         46 wire connection end
         48 circuit board connection end
      32 compensation coil support
         50, 50a, 50b coil support bobbin
         52, 52a, 52b first/connection end flange
            60 passages for magnetic circuit branches
            66 recess 53 outer side
54, 54a, 54b second end flange
56 passages for magnetic circuit branches
8 magnetic field detector
10 circuit board
  34 connection terminals
  36 first orifice (for first longitudinal magnetic circuit branch)
  38 second orifice (for second longitudinal magnetic circuit branch)
  11 outer face
  13 inner face
  66a metallized pad (grounding pad)
  66b metallized pad
12 housing

The invention claimed is:

1. A closed-loop current transducer comprising a magnetic circuit core to conduct magnetic flux and concentrate a magnetic field, a circuit board, a magnetic field detector connected to the circuit board and positioned in a magnetic circuit gap of the magnetic circuit core, and a compensation coil assembly comprising a compensation coil and a compensation coil support comprising at least one coil support bobbin, a connection end flange at one end of the coil support bobbin and a second flange at a second end of the coil support bobbin, the compensation coil being wound around the coil support bobbin between the connection end flange and the second flange, the magnetic circuit core comprising a first longitudinal branch, a second longitudinal branch, and first and second end branches interconnecting the first longitudinal branch and the second longitudinal branch such that the first longitudinal branch and the second longitudinal branch surround a central opening configured to receive one or more primary conductors therethrough, the magnetic circuit core being formed of first and second parts assembled together from opposed ends of the compensation coil support, wherein the circuit board is mounted against the connection end flange and the first part of the magnetic circuit core comprises the first end branch and is assembled from an outer face of the circuit board relative to the connection end flange such that the first end branch is positioned adjacent and against said outer face of the circuit board, the circuit board comprising orifices through which portions of the first longitudinal branch and the second longitudinal branch extend through the circuit board.

2. Transducer according to claim 1, wherein the first end branch of the magnetic circuit core contacts at least one conductive circuit pads on the outer face of the circuit board that is connected to ground.

3. Transducer according to claim 2, wherein the first end branch is soldered to the at least one conductive circuit pads.

4. Transducer according to claim 1, wherein the first end branch of the magnetic circuit core comprises one or more contact protrusions that press against the at least one conductive circuit pads.

5. Transducer according to claim 1, wherein the first part of the magnetic circuit core comprises a portion of the second longitudinal branch and the second part of the magnetic circuit core comprises a portion of the second longitudinal branch whereby said portions overlap and press against each other to ensure contact between said portions and reduce a magnetic reluctance therebetween.

6. Transducer according to claim 5, wherein said portions of the second longitudinal branch overlap each other substantially over an entire length between the connection end flange and the second flange.

7. Transducer according to claim 1, wherein a portion of the first longitudinal branch of the first part of the magnetic circuit core extends through the thickness of the circuit board to an inner face of the circuit board on which the magnetic field detector is mounted whereby an end of said portion of the first longitudinal branch of the first part is positioned facing an end of a portion of the first longitudinal branch of the second part to form the magnetic circuit gap, the magnetic field detector being mounted on the circuit board inner face.

8. Transducer according to claim 1, wherein the connection end flange comprises a recess configured to allow the positioning of the magnetic field detector and other components mounted on the circuit board within the recess.

9. Transducer according to claim 1, wherein the magnetic field detector is a Hall effect sensor provided in the form of an application specific integrated circuit (ASIC) with connection terminals connected to circuit traces on the circuit board.

10. Transducer according to claim 1, wherein a major plane of the circuit board is parallel to a major plane of the connection end flange, said major planes being arranged orthogonal to the first and second longitudinal branches of the magnetic circuit core.

11. Transducer according to claim 1, wherein the compensation coil assembly comprises connection terminals, the connection terminals comprising a wire connection post for connection of a compensation coil wire end thereto and a pin terminal connection end for plugging into conductive through holes in the circuit board.

12. Transducer according to claim 1, wherein the compensation coil assembly comprises a first coil support bobbin with a first portion of the compensation coil wound therearound, and a second coil support bobbin with a second portion of the compensation coil wound therearound, the first coil support bobbin mounted on the first longitudinal branch of the magnetic circuit core, and the second coil support bobbin mounted on the second longitudinal branch of the magnetic circuit core, and wherein the first and second portions of the compensation coil are formed of a single uninterrupted wire.

13. Transducer according to claim 12, wherein the number of turns of the compensation coil wound around the first coil support bobbin is greater than the number of turns of the compensation coil wound around the second coil support bobbin.

14. Transducer according to claim 13, wherein the first and second parts of the magnetic circuit core each comprise two or more stacked layers of strips of magnetic material.

* * * * *